United States Patent [19]

Bertails et al.

[11] 4,419,631

[45] Dec. 6, 1983

[54] INTEGRATED CIRCUIT AMPLIFIER FUNCTIONING IN CLASS AB AND INCORPORATING CMOS (METAL OXIDE SEMICONDUCTOR) TECHNOLOGY

[75] Inventors: Jean P. Bertails; Cristian Perrin; Louis Tallaron, all of Paris, France

[73] Assignee: Societe pour Lietude et la Fabrication des Circuits Integres Speciaux (EFCIS), Grenoble, France

[21] Appl. No.: 314,025

[22] Filed: Oct. 22, 1981

[30] Foreign Application Priority Data

Oct. 23, 1980 [FR] France .................. 80 22662

[51] Int. Cl.³ .................. H03F 3/45; H03F 3/26
[52] U.S. Cl. .................. 330/255; 330/267; 330/300
[58] Field of Search .......... 330/149, 255, 264, 300, 330/267

[56] References Cited

U.S. PATENT DOCUMENTS 4,174,503 11/1979 Merklinger et al. .................. 330/300

Primary Examiner—James B. Mullins
Assistant Examiner—Gene Wan
Attorney, Agent, or Firm—Cushman, Darby & Cushman

[57] ABSTRACT

This invention concerns an integrated-circuit amplifier incorporating CMOS (metal oxide semiconductor) technology, which amplifiers are capable of supplying a standardized 600 Ohm load, for example.

This amplifier functions in class AB, and its output stage comprises an NPN bipolar transistor and an N-channel MOS transistor, connected in series in the same way as a conventional push-pull stage.

The NPN transistor is controlled directly at its base by the signal for amplification. The control grid of the MOS transistor receives the output signal from a differential amplifier, one input of which is connected to the amplifier output S, the other input being connected to the emitter of another bipolar transistor, the base of which receives the signal for amplification.

5 Claims, 2 Drawing Figures

INTEGRATED CIRCUIT AMPLIFIER FUNCTIONING IN CLASS AB AND INCORPORATING CMOS (METAL OXIDE SEMICONDUCTOR) TECHNOLOGY

BACKGROUND OF THE INVENTION

This invention concerns silicon-based integrated circuits, using CMOS (metal oxide semiconductor) technology, i.e. basically comprising field-effect transistors with control grids insulated by an oxide.

This technology is used in linear amplifiers. However, if an increase in the available output power is needed, there has to be a limitation, first on the output impedance (too high for MOS transistors, for example if a standardized 600 Ohm load is to be supplied), and second on the dimensions of the output transistors in the integrated circuit: for same output current, an MOS transistor takes up more room than a bipolar transistor.

It would therefore be an advantage for the amplifier output stage to contain bipolar transistors, and this is in fact possible using CMOS technology: the resulting integrated circuit then comprises both bipolar transistors and MOS field-effect transistors.

Consideration might be given to the conventional use of an output stage with two NPN and PNP bipolar transistors, in a push-pull assembly, to make the amplifier function in class B or AB, namely with sufficient linearity, and also with an operating current when at rest that is either 0 (for class B), or low enough not to produce excessive losses (for class AB).

Unfortunately, only NPN bipolar transistors can be mounted with MOS transistors on the same substrate. There is no simple way to obtain a PNP transistor and an NPN transistor with symmetrical characteristics, for push-pull mounting, in MOS technology.

SUMMARY OF THE INVENTION

This invention consequently offers a way of obtaining an amplifier with an output stage that functions in either class B or class AB, by mounting an NPN bipolar transistor in series with an N-channel MOS transistor with large geometrical characteristics (in order to obtain an adequate output current), which performs the same role as the PNP bipolar transistor in a conventional push-pull stage.

This raises the problem of how to control the N-channel MOS transistor simultaneously with the NPN bipolar transistor, in order to obtain the same type of functioning as a bipolar push-pull stage, namely good linearity, low enough consumption when at rest, and symetrical positive and negative functioning.

It is not possible, as in pure bipolar assemblies, to have a single attack transistor for both power transistors, with two compensating diodes, which bring functioning when at rest close to 0.

This invention therefore proposes an amplifier stage comprising:

a first NPN bipolar transistor and an N-channel MOS transistor (NMOS), connected in series, as already mentioned, in the same way as a push-pull stage, the junction between the NPN transistor emitter and the NMOS transistor drain forming the amplifier output;

a second NPN bipolar transistor, the base of which, in the same way as the first NPN transistor, receives the signal for amplification, this second transistor being mounted basically as a voltage follower;

a differential amplifier, used to control the NMOS transistor, on the basis of the voltage difference at the emitters of the first and second bipolar transistors, each amplifier input accordingly being connected to an emitter, and the output being connected to the NMOS transistor control grid, the direction of connection of the inputs being such that the differential amplifier tends to subordinate the emitter voltage from the first NPN transistor to the emitter voltage of the second (itself controlled by the signal for amplification).

Consequently, the signal for amplification directly controls the conduction of the first transistor; but it also indirectly controls the conduction of the NMOS transistor, through a second bipole transistor, the follower emitter of which reproduces the voltage for amplification, and a differential amplifier, which acts on the conduction of the MOS transistors, in a way that tends to subordinate the output voltage from the amplifier stage to the voltage for amplification.

The emitter voltage of the second bipolar transistor follows this voltage closely (to within the extent of the base/emitter voltage), since the second bipolar transistor, unlike the first one, has a very low load, and functions in class A, namely on a very linear basis.

The accuracy of reproduction of the voltage for amplification is greatly increased if a current source (an MOS transistor) is connected in series with the second bipolar transistor emitter.

The two NPN bipolar transistors may have significantly different geometrical characteristics (the first transistor being the larger in most cases, because it is situated at the actual power amplifier stage output, while the second is often of minimal size).

In fact, the ratio of their geometrical characteristics, on which the current in the first NPN transistor when at rest will depend, is chosen to suit the load resistance, and accordingly the current to be supplied by the circuit.

The detailed description below explains the effect of geometrical characteristics on the current at rest.

In order to reduce the effect of the voltage difference and displacement voltage of the differential amplifier, resistances are placed in the bipolar transistor emitters, to provide negative feedback, reducing the sensitivity of transistors to base voltage variations. The ratio of the relative values of these resistances is the opposite of the ratio of the geometrical characteristics of the corresponding transistors.

The differential amplifier may be a conventional amplifier with MOS transistors with current mirrors, possessing a current source that supplies in parallel two pairs of series-connected MOS transistors.

BRIEF DESCRIPTION OF THE DRAWINGS

The following description reveals other features and benefits of this invention, with reference to the accompanying illustrations.

DETAILED DESCRIPTION OF PREFERRED EMBODIMENTS

Figure 1:
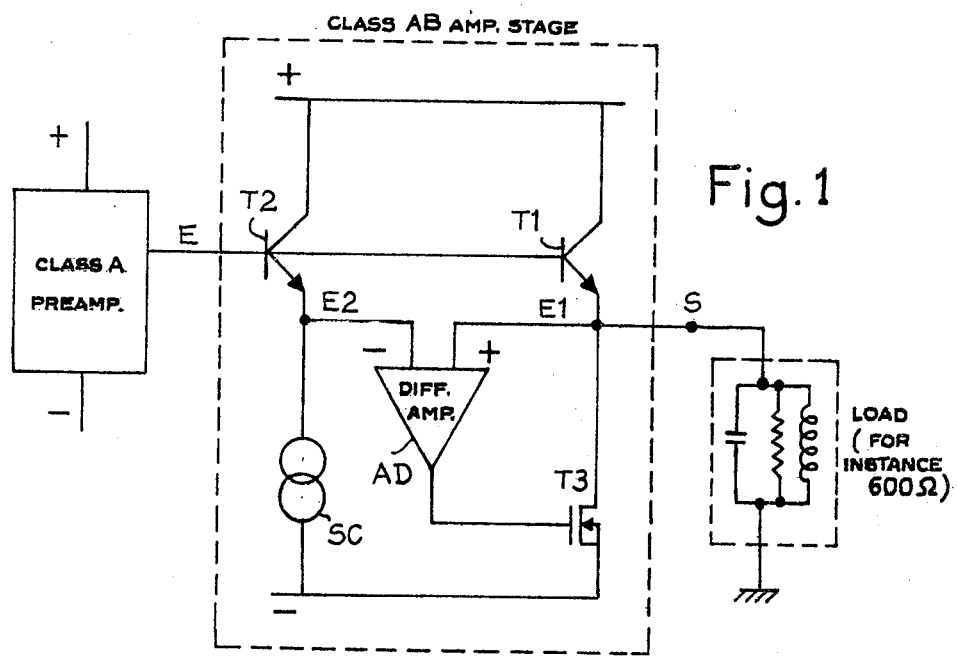
FIG. 1, showing a general diagram of the amplifier.

This new amplifier, designed to function in class AB, comprises several preamplifier stages and an output stage, which is the stage actually functioning in class AB. The invention relates only to this output stage, and FIG. 1 merely indicates the input preamplifier, generally functioning in class A, and connected to the output stage input, the output of which is being connected to the load. In one embodiment, the amplifier is connected to a 600 Ohm load.

The preamplifier stages and output stage are incorporated on the same silicon substrate, and use CMOS technology, which, as already explained, allows NPN bipolar and MOS transistors to be mounted on the same substrate.

The amplifier output stage comprises a first NPN bipolar transistor $T_1$, the base of which is connected directly to the output stage input E, and which consequently receives the signal for amplification from the preamplifier stages.

The same signal for amplification is also received at the base of another NPN bipolar transistor, the function of which is to produce at its emitter $E_2$, a signal reproducing the input signal.

The first bipolar transistor $T_1$ is connected in series, like a push-pull assembly, with an N-channel MOS transistor $T_3$. Transistors $T_1$ and $T_3$ are connected in series between the negative and positive supply terminals of a symmetrical power supply, and the amplifier stage output S comes from the junction between the emitter $E_1$ of transistor $T_1$ and the drain of transistor $T_3$. This output S is taken in relation to the earth common to the symmetrical power supplies, as is done in bipolar push-pull stages.

The aim is to have the amplifier stage function in class AB, i.e. neither completely in class A, in which the output signal would be more linear, but would require high current in transistors $T_1$ and $T_3$ when at rest, and therefore excessive consumption under no load, nor absolutely in class B, in which the current at rest is practically nil, but where there are linearity problems, because of the connection distortion between the positive and negative alternations on the output terminal S, transistor $T_1$ taking complete charge of positive alternations, and transistor $T_3$ taking complete charge of negative ones.

This system functions in class AB, i.e. with a permanent current that passes through transistors $T_1$ and $T_3$ even when they are at rest, without any signal at the amplifier input E. During positive alternations of the signal, transistor $T_1$ mainly conducts the current to the load, whereas transistor $T_3$ shunts part of this current; during negative alternations, transistor $T_3$ absorbs most of the current, whereas transistor $T_1$ continues to conduct a little.

During positive alternations of the signal for amplification reaching the input E, the output voltage at S, in other words at the emitter $E_1$ of transistor $T_1$, more or less follows the voltage of the signal for amplification, since transistor $T_1$ receives this signal on its base, and its emitter follows it exactly, to within the extent of the base/emitter voltage.

During negative alternations, the current must be shunted through the output stage from the load, and transistor $T_1$ cannot perform this function, because it is connected to the positive terminal of the symetrical power supply. So transistor $T_3$ has to receive current from the load, and make it pass to the negative supply terminal.

To this effect transistor $T_3$ is controlled by the output of a differential amplifier AD, the non-inversing and inversing inputs of which are connected respectively to the emitter $E_1$ of transistor $T_1$ and the emitter $E_2$ of transistor $T_2$. The control grid of transistor $T_3$ is connected to the differential amplifier output, and transistor $T_3$ conduction therefore depends on the difference between the emitter voltages of transistors $T_1$ and $T_2$.

Since the increase in the grid voltage of transistor $T_3$ increases its conduction, and correspondingly reduces the potential of output S, this output S is subordinated to the emitter voltage of transistor $T_2$. If this voltage drops, conduction in $T_3$ will increase, and cause a reduction in the output voltage at S, while if the voltage at $E_2$ increases, conduction in $T_3$ will fall, and S will increase.

The NPN bipolar transistor $T_2$ is connected as a follower emitter, i.e. its collector is connected to the positive supply terminal, the output is taken from emitter $E_2$, and the emitter load consists of a current source SC, in series between the emitter and the negative supply terminal. Consequently, given the constant current flowing through transistor $T_2$, its base/emitter voltage is constant, and the input signal for amplifier reaching input E is reproduced at emitter $E_2$, to within the extent of the constant base/emitter voltage.

The differential amplifier AD detects the difference between the output voltage at S and this voltage at $E_2$, and controls transistor $T_3$, in such a way as to make the input voltage be followed by the output.

During positive alternations of the signal for amplification, transistor $T_1$, controlled by its base, conducts to the load as much current as needed for the output potential at S to follow the input voltage at E. Meanwhile, the differential amplifier AD naturally tends to reduce the current flowing through transistor $T_3$, because the potential at $E_2$ is higher than the potential at $E_1$ (because the base/emitter voltage of conducting transistor $T_1$ is normally higher than the base/emitter voltage of transistor $T_2$, which offers constant conduction). This effect becomes more pronounced as the growth of the positive signal becomes faster: if the output has difficulty in following the input, because of the speed of variation of voltage at the input, transistor $T_3$ will block faster, facilitating integral transmission to the load of all current flowing through transistor $T_1$.

During negative alternations, only transistor $T_3$ can recover the negative current circulating in the load. The differential amplifier makes $T_3$ conduct in such a way that the output voltage remains equal to the voltage at emitter $E_2$ (to within the extent of the differential amplifier voltage difference). Meanwhile, current flowing through transistor $T_1$ remains low, because its base/emitter voltage is equal to the base/emitter voltage of transistor $T_2$, less the differential amplifier voltage difference. In fact, if the input voltage varies rapidly towards negative values, the differential amplifier will act strongly on transistor $T_3$ conduction, so that output voltage will follow input voltage.

It will be noted that if the voltage difference at the differential amplifier terminals is ignored, the base/emitter voltages of transistors $T_1$ and $T_2$ are identical, and if the emitter current of transistor $T_1$ is imposed, the permanent current flowing through transistor T, when the input signal is nil or negative will be proportional to the current in transistor $T_2$, in a ratio that corresponds to the ratio of the geometrical characteristics of transistors $T_1$ and $T_2$: for example, if transistor $T_1$ is ten times larger than transistor $T_2$ (which is normal, since transistor $T_1$ forms the output stage), the current when at rest will be ten times the current from the current source SC. This obviously has to be modulated, depending on the amplitude of the voltage difference at the differential amplifier terminals.

Figure 2:
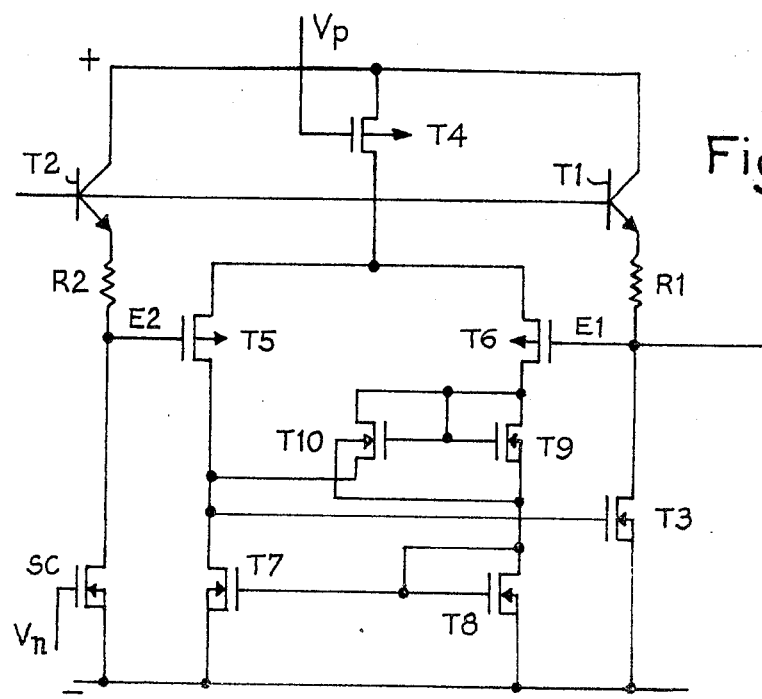
FIG. 2, showing a more detailed diagram.

FIG. 2 shows a detailed diagram of a circuit illustrating this invention. In this circuit, only $T_1$ and $T_2$ are bipolar transistors, all other components consisting of MOS transistors.

The figure shows these NPN bipolar transistors $T_1$ and $T_3$, and the MOS transistor $T_3$ with large geometrical characteristics (compared with other MOS transistors in the amplifier); these large dimensions are necessary because this transistor $T_3$, with transistor $T_1$, has to absorb the main amplifier current.

The current source SC, connected in series with the emitter of transistor $T_2$, consists simply of an MOS transistor, the control grid of which is fed at constant voltage.

The differential amplifier basically comprises, first, a conventional circuit with a current source consisting of an MOS transistor $T_4$, which supplies in parallel two pairs of series-connected MOS transistors: $T_5$ (PMOS) and $T_7$ (NMOS), and $T_6$ (PMOS) and $T_8$ (NMOS). The control electrodes of transistors $T_5$ and $T_6$ are connected respectively to the terminals $E_1$ and $E_2$ (basically the emitters of transistors $T_1$ and $T_2$), which form the differential amplifier inputs. The output is taken from the drain of transistor $T_7$, controlling the grid electrode of the large MOS transistor $T_3$, as illustrated in FIG. 1.

This is a conventional layout for a differential amplifier, having 5 MOS transistors with current mirrors. If the transistor $T_8$ drain is connected with its control grid, this produces a non-differential output voltage, positive or negative in relation to the common earth of the symmetrical power supplies. This standard MOS-transistorized differential amplifier is slightly altered, by means of two transistors $T_9$ and $T_{10}$, which establish a current shunt, in order to polarize transistor $T_3$, even when it is transistor $T_1$ that should conduct (i.e. during positive alternations of the signal for amplification).

Transistor $T_9$ is connected in series between transistors $T_6$ and $T_8$, with its drain connected to its grid. Transistor $T_{10}$ is connected in a crosswise way between the two parallel branches supplied by current source transistor $T_4$: to be more precise, it is connected between the junction of $T_6$ and $T_9$ and the junction of $T_5$ and $T_7$; its drain is connected to its control grid.

This arrangement means that when the differential amplifier is unbalanced in one direction, during negative alternations of the signal for amplification, the differential amplifier performs its normal function, with transistor $T_{10}$ blocked, whereas, during positive alternations of the voltage for amplification, the differential amplifier still supplies a polarization voltage to transistor $T_3$, so that it will conduct partly, even through it is transistor $T_1$ that is then supplying most of the current to the load. This is because transistor $T_{10}$ is made to conduct during positive alternations, current in transistor $T_6$ being divided between transistors $T_9$ and $T_{10}$, depending on their geometrical characteristics.

This results in more linear functioning, tending more towards class A than towards class B, and thereby reducing connection distortions.

FIG. 2 shows a slight change in relation to the basic diagram in FIG. 1: the presence of emitter resistances for bipolar transistors $T_1$ and $T_2$. A resistance $R_1$ has been connected in series in the emitter of transistor $T_1$ and a resistance $R_2$ in the emitter of transistor $T_2$, input points $E_1$ and $E_2$ of the differential amplifier then no longer being taken directly from the bipole transistor emitter, but after these resistance, which are therefore regarded as forming an integral part of the emitter.

Their purpose is to reduce the effect of the voltage difference at the terminals of the differential amplifier, by providing emitter feedback, making transistors $T_1$ and $T_2$ less sensitive to voltage variations at $E_1$ and $E_2$.

The ratio of the values of these resistances $R_1$ and $R_2$ is the reverse of the ratio of the geometrical characteristics of the corresponding transistors $T_1$ and $T_2$, so that they will have the same relative effect on these transistors.

What is claimed is:

1. An integrated amplifier incorporating MOS technology, and functioning in class B or AB, and characterized by the fact that its output stage comprises:
   a first NPN bipolar transistor and an N-channel MOS transistor, connected in series, the junction between the emitter of the first transistor and the drain of the second forming the amplifier output;
   a second NPN bipolar transistor, the base of which, in the same way as the first such transistor, receives the signal for amplification, this second transistor being connected basically as a voltage follower;
   a differential amplifier, the two inputs of which are connected to the emitters of the two NPN transistors respectively, and the output of which is connected to the control grid of the MOS transistor, to control its polarization, in a way that tends to subordinate the emitter voltage of the first transistor to that of the second.

2. An amplifier as defined in claim 1, in which a current source, consisting of an MOS transistor, is connected in series with the emitter of the second bipolar transistor.

3. An amplifier as defined in either of claims 1 or 2, in which a resistance is incorporated in series in the emitter of each bipolar transistor, the ratio of the values of these resistances being the reverse of the ratio of the geometrical characteristics of the corresponding transistors.

4. An amplifier as defined in claims 1 or 2, in which the differential amplifier comprises MOS transistors with current mirrors, one current source supplying in parallel two pairs of series-connected MOS transistors.

5. An amplifier as defined in claim 4, in which the differential amplifier possesses negative feedback in order to retain some conductivity in the N-channel MOS transistor connected in series with the first NPN transistor, even during positive alternations of the output voltage.

* * * * *